United States Patent
Li et al.

(10) Patent No.: US 12,169,369 B2
(45) Date of Patent: Dec. 17, 2024

(54) STORAGE FOR EXTREME ULTRAVIOLET LIGHT LITHOGRAPHY

(71) Applicant: Taiwan Semiconductor Manufacturing Co., Ltd., Hsinchu (TW)

(72) Inventors: Guancyun Li, Hsinchu (TW); Ching-Jung Chang, Hsinchu (TW); Chi-Feng Tung, Hsinchu (TW); Hsiang-Yin Shen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 664 days.

(21) Appl. No.: 17/461,703

(22) Filed: Aug. 30, 2021

(65) Prior Publication Data

US 2023/0066297 A1    Mar. 2, 2023

(51) Int. Cl.
*G03F 7/00* (2006.01)
*G05B 19/4155* (2006.01)
*G06N 20/00* (2019.01)

(52) U.S. Cl.
CPC ...... *G03F 7/70866* (2013.01); *G03F 7/70491* (2013.01); *G03F 7/70741* (2013.01); *G05B 19/4155* (2013.01); *G06N 20/00* (2019.01); *G05B 2219/39147* (2013.01); *G05B 2219/45031* (2013.01)

(58) Field of Classification Search
CPC .. G03F 7/70858; G03F 7/708; G03F 7/70741; G03F 7/7075; G03F 7/70908; G03F 7/70925; G03F 7/70933; G03F 7/70991; G03F 1/66
See application file for complete search history.

(56) References Cited

U.S. PATENT DOCUMENTS

| | | | |
|---|---|---|---|
| 2004/0055177 A1* | 3/2004 | Tsuji | G03F 7/70858 34/62 |
| 2004/0105080 A1* | 6/2004 | Teunissen | G03F 7/70933 355/53 |
| 2013/0286365 A1 | 10/2013 | Chen et al. | |
| 2018/0196360 A1* | 7/2018 | Van Bokhoven | G03F 7/70858 |
| 2018/0286726 A1* | 10/2018 | Rebstock | G03F 7/70741 |
| 2018/0374733 A1* | 12/2018 | Pannese | H01L 21/67769 |
| 2020/0073258 A1* | 3/2020 | Chiu | G03F 7/70725 |

FOREIGN PATENT DOCUMENTS

TW    202129826 A    8/2021

* cited by examiner

*Primary Examiner* — Steven H Whitesell
(74) *Attorney, Agent, or Firm* — Seed IP Law Group LLP

(57) ABSTRACT

An EUV stocker and an EUV pod device is disclosed. The EUV stocker includes an AI driven dynamic control circuitry, an AI controlled safety interlock, and an independent air return control device. The EUV stocker includes a Mass Flow Control (MFC) that operates in conjunction with one or more valves. The EUV stocker further includes a hydrocarbon detecting assembly, oxygen detecting assembly, pressure detecting assembly, and temperature detecting assembly and more to maintain the required condition within the EUV stocker. The EUV stocker also includes automated transportation devices such as AMHS, OHT, MR, AGV, RGV, or the like to provide a safe EUV mask storage environment for operators.

20 Claims, 12 Drawing Sheets

STORAGE FOR EXTREME ULTRAVIOLET LIGHT LITHOGRAPHY

BACKGROUND

To produce semiconductor devices and a semiconductor substrate, a silicon wafer, which is a raw material for the semiconductor devices, must go through a sequence of complicated and precise process steps. Often times, to complete the sequence, the wafer must be physically transported from one piece of fabrication equipment to another piece of fabrication equipment. Within these pieces of fabrication equipment various processes such as diffusion, ion implantation, chemical vapor deposition, photo lithography, etch, physical vapor deposition, and chemical mechanical polishing are carried out on the wafer. To efficiently move the wafer through the sequence and between the different pieces of fabrication equipment in a semiconductor fabrication plant (commonly called "fab"), a plurality of wafers are housed in in-a front opening unified pods (FOUP) and an automated material handling system (AMHS) is implemented in the fab to move the FOUP from one piece of fabrication equipment to another piece of fabrication equipment.

In some instances, an overhead hoist transport (OHT) vehicle is a part of the AMHS in the fab. The overhead transport vehicle is utilized to transport the FOUP by traveling on an overhead track and accessing a load port of a stocker or other process equipment directly. For example, the transported wafers are stocked in extreme ultraviolet light (EUV) pod storages before further process is applied to the wafers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
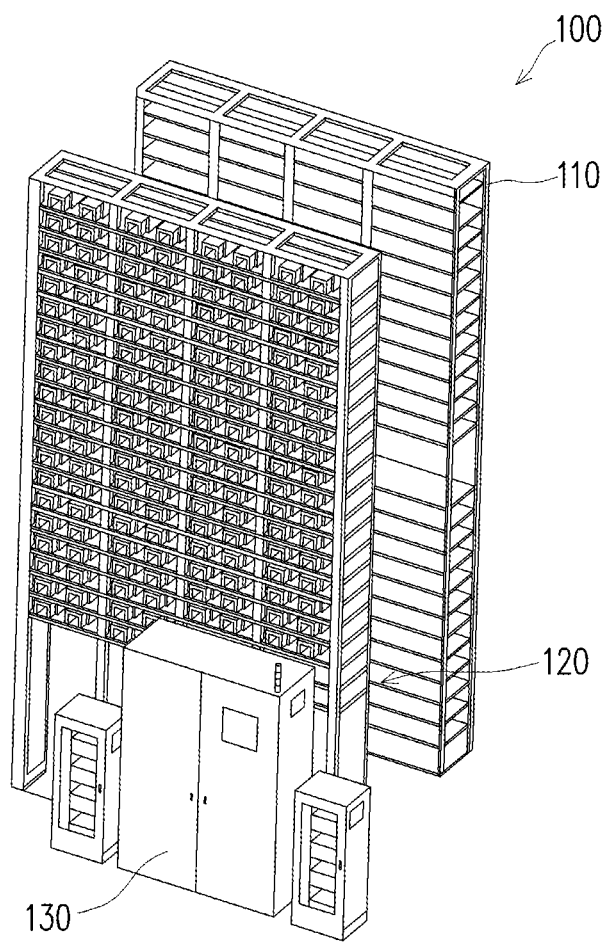
FIG. 1 is a perspective view of a stocker system with an artificial intelligence (AI) driven dynamic controller in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more embodiments of the present disclosure relates to EUV storage systems or stocker systems for workpieces (e.g., mask, reticle, or the like). The stocker according to the present disclosure, in some embodiments, is used to store EUV masks. The EUV mask is used to pattern the feature on the wafer or substrate (e.g., silicon). In some embodiments, the EUV mask is stored in an EUV pod or a storage device for storing EUV masks. Supplying insufficient $N_2$ gas (nitrogen gas) to the EUV pod increases the likelihood of contamination of the EUV masks stored inside the EUV pod. That is, it is beneficial to supply $N_2$ gas to the EUV pod while the EUV pod storage is in the stocker because it will reduce contamination of the EUV masks which will contribute to an improved lithograph quality on a substrate (e.g., silicon substrate). Not supplying the $N_2$ gas in the EUV POD at a desired threshold level may allow precipitation of materials (e.g., moisture) on the EUV mask while they are stored in the EUV pod. In some cases, when the EUV pod containing EUV masks is transferred to the EUV tool for the exposing process, due to the precipitation of materials on the EUV masks, the ability of the EUV masks to pattern features within critical dimension limits may be reduced.

The $N_2$ gas may also be used to reduce or control hydrocarbon concentration of environments where the EUV pod storage units are stored or stocked. Reducing or controlling the hydrocarbon concentration in such environments is desirable because the presence of hydrocarbon may damage or impact the EUV masks (e.g., EUV mask quality) or other aspects of an EUV lithography process or equipment. For example, particles of hydrocarbon may coat or deposit onto EUV masks and thereby alter and/or damage the EUV masks in a way that adversely effects the results of the exposure through the EUV masks. Accordingly, the hydrocarbon present in the EUV pod as well as other gas may cause the EUV masks to produce patterns on wafers where the critical dimensions of each wafer differs. Thus, it is beneficial to reduce the concentration of hydrocarbon in an EUV pod storage system by using the $N_2$ gas in accordance with embodiments of the present disclosure.

Further aspects of the present disclosure includes a dynamic controller operatively coupled to the stocker system 100. In some embodiments, the dynamic controller is driven by artificial intelligence (AI) technology that allows the dynamic controller to intelligently control gas supply to and flow within the stocker system 100. Further, the dynamic controller may change the type of gas supplied to the storage area or stocker, may control the pressure within the storage area and may control the humidity in the storage area. Because $N_2$ gas may be very dangerous to operators (e.g., engineers) working within the stocker system environment, control of the various gases supplied within the stocker environment is beneficial. The AI driven controller provides automatic control of the type and amount of gas supplied to the storage space to secure the safety of the operators. In one or more embodiments, the storage space includes EUV pods including therein EUV masks. Because increasing the amount of $N_2$ gas supplied to the storage space may cause a decrease in the concentration of $O_2$ gas in the storage space, the controller controls the mass flow of gas (e.g., nitrogen and/or oxygen) via a mass flow control device (MFC) (or other device to control the flow of nitrogen or air) to automatically control the supply of $N_2$ gas to the storage system or the individual storage spaces/units.

In some embodiments, the EUV pod stockers are located adjacent to an area within the fab where other expensive EUV lithography tools are located. One of the benefits of the stocker system 100 according to the present disclosure is to provide an air supply subsystem for the stockers 101 that store the EUV pods that include EUV masks that will be used by the EUV lithography equipment that is independent of the air supply system for the other EUV lithography equipment. In accordance with embodiments of the present disclosure, such independent air supply system is separated from the area of the fab where the other EUV lithography equipment is located. Utilizing an air supply system that is independent from the air supply system of the other EUV lithography equipment, and maybe located in an area of the fab that is different from the area where the other EUV lithography equipment is located, reduces the risk that events (e.g., a fire or gas leak) that occur in the area of the fab where the air supply system for the EUV pod stocker system is located would adversely affect (e.g., contaminate) the air supply system of the other EUV lithography equipment, and vice versa. In some embodiments, the independent air supply subsystem of the stocker system 100 includes a MAU (Make-up Air Unit), a FFU (Fan Filter Unit), and a DCC (Dry Cooling Coil) to maintain an independent air return design that separates the air supply system of the stocker system 100 and the air supply system of the other EUV tools. The stocker system provides additional benefits of protecting the EUV tools. Other technical benefits of the present disclosure will be detailed further in conjunction with the drawings.

FIG. 1 is a perspective view of a portion of a stocker system 100 including an artificial intelligence (AI) driven dynamic controller in accordance with some embodiments.

Referring to FIG. 1, the stocker system 100 includes a multi-cassette rack 110, and a multi-cassette sorter 120. The multi-cassette rack 110 includes a multi-cassette port and a multi-cassette overhead hoist transport port not shown (hereinafter "OHT port" or "multi-cassette OHT port"). The multi-cassette rack 110 and multi-cassette sorter 120 are contained with a stocker (101 in FIG. 3).

In accordance with some embodiments described herein, the stocker system 100 is integrated into an existing AMHS in a fab.

In accordance with embodiments described herein, the stocker system 100 provides temporary storage for various types of cassettes, including cassettes containing EUV masks, semiconductor workpieces or substrates, as the cassettes work their way through the different tools and equipment in the fab.

In one or more embodiments, the stocker system 100 is operatively coupled to an AI driven dynamic controller 130. In other embodiments, the AI driven dynamic controller 130 may be implemented within the stocker system 100.

The controller 130 may include any electrical circuitry, features, components, an assembly of electronic components or the like configured to perform the various operations of the data collecting and control features as described herein. For example, the controller 130 may include any processor-based or microprocessor-based system including systems using microcontrollers, reduced instruction set computers (RISC), application specific integrated circuits (ASICs), field-programmable gate arrays (FPGAs), graphical processing units (GPUs), logic circuits, and any other circuit or processor capable of executing the functions described herein.

In some embodiments, the controller 130 may be included in or otherwise implemented by processing circuitry such as a microprocessor, microcontroller, integrated circuit, chip, microchip or the like.

The controller 130 may also include a memory. The various AI algorithms and instructions related in implementing the AI features described herein may be stored in the memory. The memory may include Random Access Memory (RAM), Read Only Memory (ROM), a hard disk drive or a removable storage drive such as an optical disk drive, solid state disk drive (e.g., flash RAM), and the like. The memory may also be other similar means for loading computer programs or other instructions into the computer or processor. In some embodiments, the memory may also be operatively coupled to the controller 130 and may not be included in the controller 130.

In some embodiments, the stocker system 100 includes an EUV pod stocker 101 or an EUV pod storage. These EUV pod stocker or EUV pod storage are one example of a storage space (or storage units) that store one or more masks (e.g., EUV masks). In some embodiments, the EUV masks are stored in individual EUV pods and the individual EUV pods are stored in the EUV pod stocker 101 of the stocker system 100.

Figure 2:
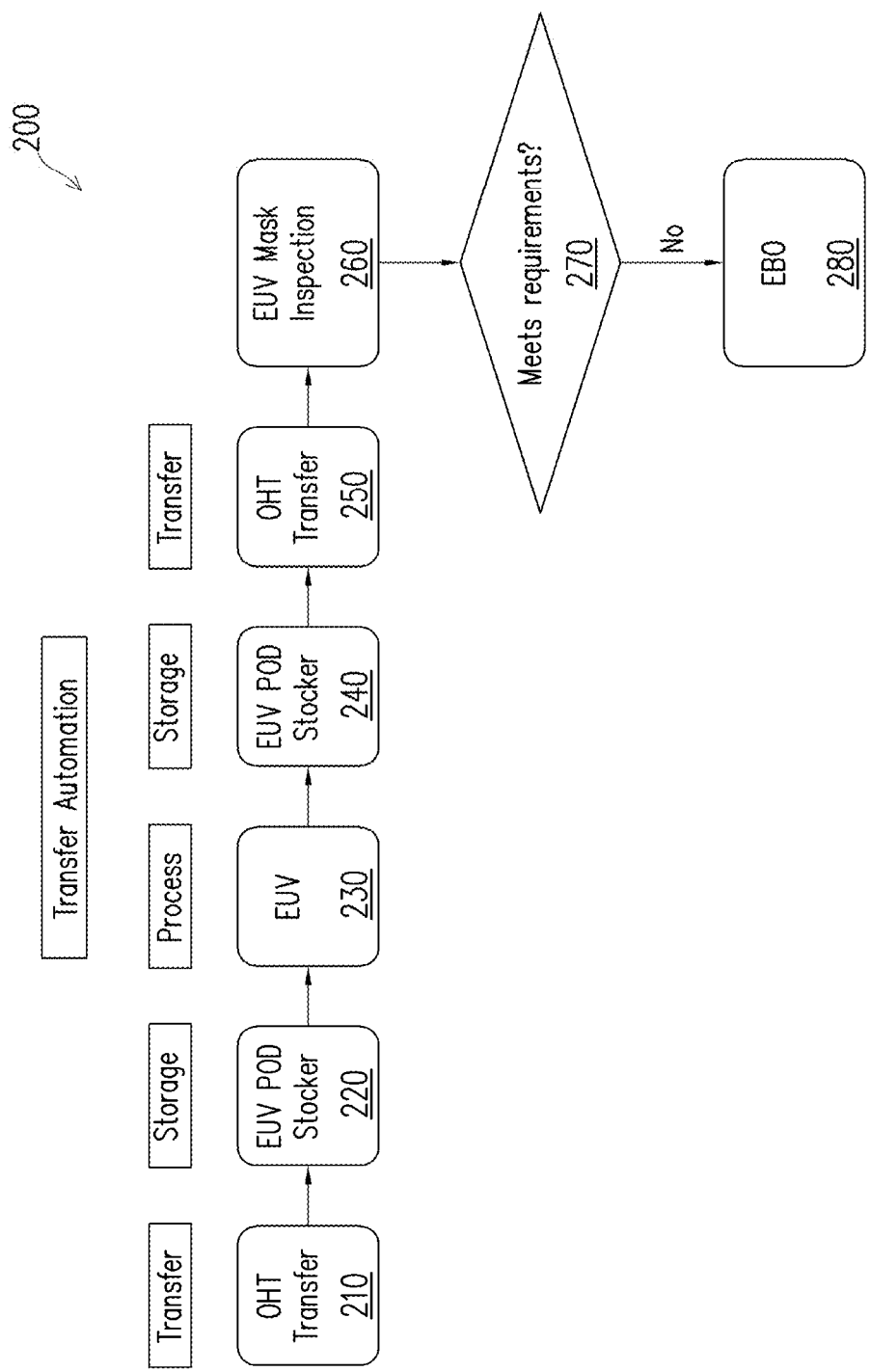
FIG. 2 is an EUV lithography process flow in accordance with some embodiments.

FIG. 2 is an EUV process flow in accordance with some embodiments.

The EUV process flow 200 involves applying the EUV process against the substrates or wafers. Initially, the EUV pods (including at least one EUV mask stored therein) are transferred using the OHT port to the EUV pod stocker at step 210. The OHT can transfer EUV pods between EUV pod stocker and EUV system (EUV process system where EUV process is performed). The OHT port transports the EUV pods in the EUV pod stocker and the EUV pods are stored in the EUV pod stocker at step 220. The EUV pods are moved from the EUV stocker to an EUV system where the EUV masks are used in an EUV process at step 230. In the EUV system, the EUV mask is removed from the EUV pod, and the EUV mask is used in a EUV tool where a substrate placed in the EUV system is patterned via a lithography process. After the lithography process at step 230 is completed, the EUV mask is moved back to the EUV pod. At step 240, the OHT transfers the EUV pod with the used EUV mask to the EUV pod stocker. At step 250, EUV pods including used or unused EUV masks may be transferred for EUV mask inspection using the OHT. At step 260, an inspection is performed to check whether the EUV mask meets the quality requirements, e.g., critical dimension criteria. At step 270, it is determined whether the EUV mask meets the quality requirements. If it is determined that the EUV mask fails to meet the quality requirements, the process proceeds to step 280. If it is determined that the EUV mask meets the quality requirements, the EUV mask is returned to the EUV pod. When an EUV mask fails the EUV mask inspection performed at step 270, the EUV mask undergoes an electron beam operation EBO at step 280. The EBO process is designed to repair the EUV masks that have failed the EUV mask inspection.

In one or more embodiments, the controller 130 operatively connected to the EUV pod stocker 101 (e.g., a subset of the stocker system 100), may control the internal components within the EUV pod stocker 101 so that a safety interlock process is in place. In addition, the controller 130 may control the OHT port so that the storage process is automated and the transfer process is automated. Further, the controller 130 is configured to control the gas supplied within the EUV pod stocker. For example, the controller 130 may control the type of gas (e.g., $N_2$, $O_2$, or the like) provided into the EUV pod stocker 101, the level of pressure maintained within the EUV pod stocker 101, the temperature within the EUV pod stocker 101, the humidity inside the EUV pod stocker 101, the detection of hydrocarbon within the EUV pod stocker 101, and the like. The controller 130 is further configured to ensure that one or more operators working within the EUV pod stocker 101 are operating under safe conditions. Also, in some embodiments, the controller 130 controls air circulation within the EUV pod stocker 101.

In one or more embodiments, a hydrocarbon sensor may be installed in the EUV pod stocker 101 of the stocker system 100. For example, instead of the hydrocarbon sensor being installed inside an individual EUV pod, one or more hydrocarbon sensors may be positioned at various locations within the stocker 101. Such hydrocarbon sensors are configured to detect a concentration of hydrocarbon in the stocker 101. As explained in more detail below, the detected hydrocarbon concentration is utilized to ensure that the hydrocarbon concentration in the stocker 101 is maintained at a desirably low level. In alternative embodiments, hydrocarbon sensors can be provided within individual EUV pods to determine the hydrocarbon concentration in an individual EUV pod.

In some embodiments, the controller 130 which is operatively connected to the EUV pod stocker 101 causes one or more of the above functions to be performed and controlled when the substrates (e.g., EUV masks) are stored within the EUV pod stocker (for example, at step 220). Further, in one or more embodiments, the operation of the controller 130 may be assisted with AI technology. The details of the operations of the AI driven dynamic controller 130 will be further detailed below.

Figure 3A:
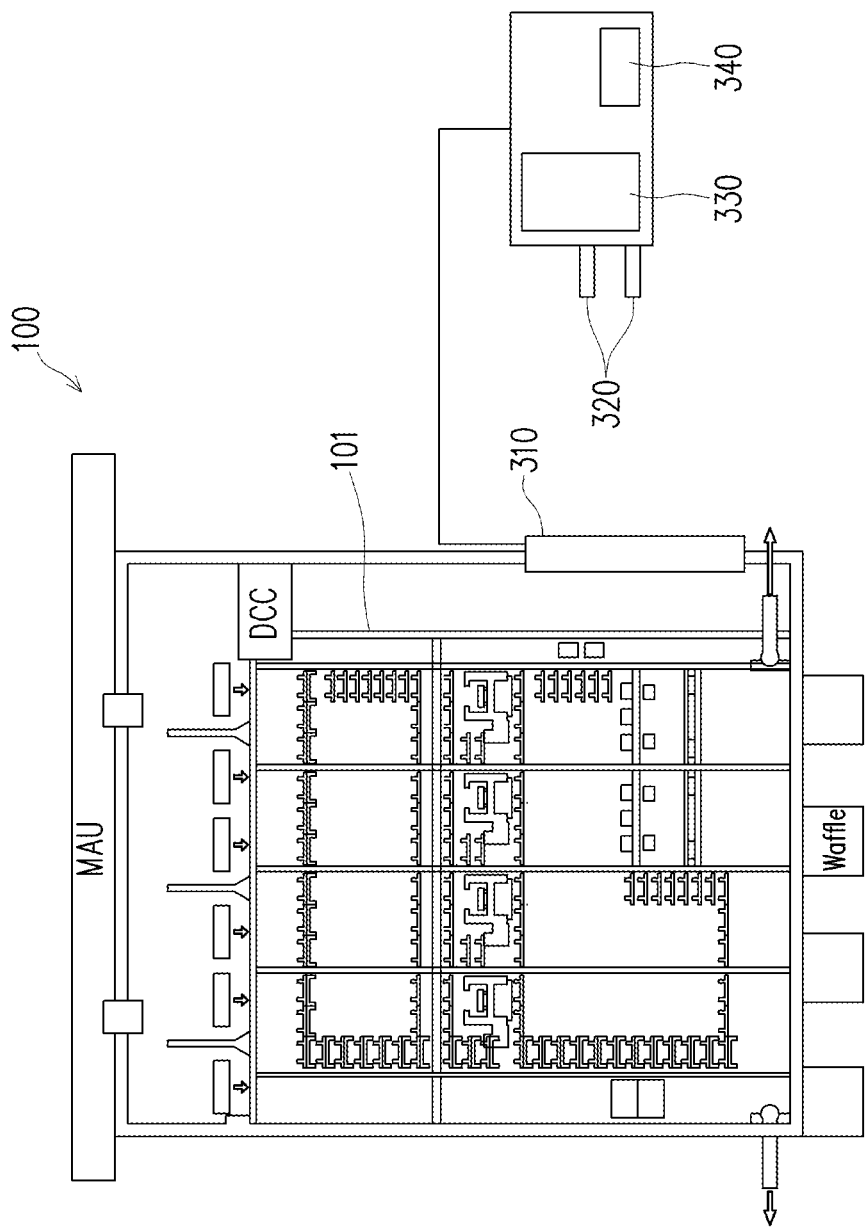
FIG. 3A is a side view of a stocker system and a process for safety interlock in accordance with some embodiments.

FIG. 3A is a side view of a stocker system and a process for safety interlock in accordance with some embodiments.

In FIG. 3A, a side view of a stocker system 100 is illustrated. Before operators can enter the stocker system 100, the controller 130 activates an automatic safety interlock process which may be driven with AI technology.

Figure 5A:
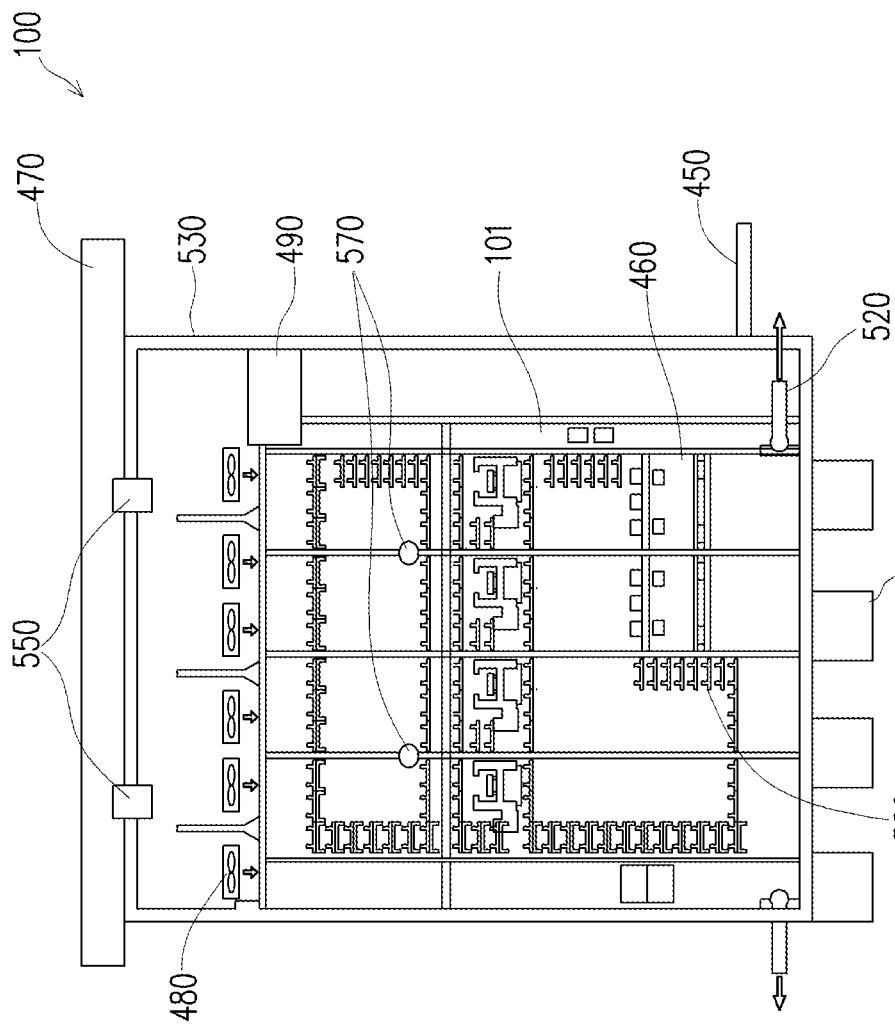
FIG. 5A is a view of a stocker system from an A-A side of FIG. 4 in accordance with some embodiments.

The stocker system 100 includes an entrance system 310 into the independent air return boundary 530 in FIG. 5A. In some embodiments, the entrance system 310 may be referred to as a safety interlock assembly or a safety interlock subsystem. The entrance system 310 includes an oxygen cylinder detection module 320 (or an oxygen cylinder detection assembly 320) that is configured to inspect the level of oxygen contained in cylinders (or oxygen supply) that are utilized by operators as a source of oxygen when the operators enter the stocker system 100. In an embodiment, the oxygen cylinder detection assembly includes oxygen pressure detector for detecting pressure within the oxygen cylinders. The entrance system 310 further includes an operator mask and piping scanning module 330 (or an operator mask and piping scanning assembly 330). The operator mask and piping scanning assembly 330 is configured to scan whether the operator mask and the oxygen delivery pipes or conduits for the operator masks are properly operating before the operators wearing the operator masks and oxygen cylinders enter into the stocker system 100. The entrance system 310 further includes an operator identifier scanning module 340 (or an operator identifier scanning assembly 340). The operator identifier scanning assembly 340 is configured to scan the operator ID of the operators entering the stocker system 100. The operator identifier scanning assembly 340 ensures that at least two operators enter the stocker system 100 at the same time. The entrance system 310 ensures the safety of the operators who enter the stocker system 100 when the stocker system 100 is under operation by ensuring that a suitable oxygen supply is available, that the oxygen masks worn by the operators are operating properly. For example, if at least one of the operations by the oxygen cylinder detection assembly 320, the operator mask and piping scanning assembly 330, and operator identifier scanning assembly 340 are not performed and positive results confirmed, the operators entering into the stocker system 100 may experience a lack of oxygen and the physiological risks associated with a lack of oxygen after entering the stocker system 100. For instance, if the oxygen pressure detector (or the oxygen sensor) senses that the pressure of the $O_2$ cylinder is below a level necessary to supply an adequate supply of oxygen to the operator (e.g., less than 5 MPa), the operators may end suffering a lack of oxygen after entering the stocker system 100. Accordingly, the oxygen pressure within the oxygen cylinders that will be used by the operators is detected so that the pressure in the oxygen cylinder is equal to or higher than 5 MPa. Here, a threshold level of the oxygen pressure is selected as 5 MPa. However, in other embodiments, based on various different settings, the threshold level may be a different value, e.g., higher than or less than 5 MPa.

Figure 3B:
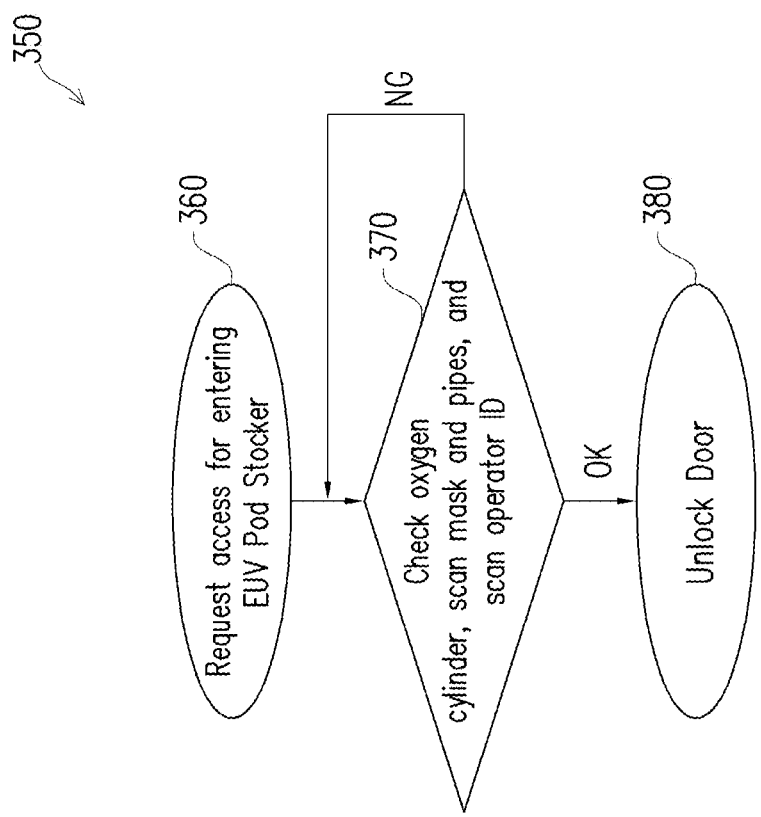
FIG. 3B is a flow chart of a safety interlock process in accordance with some embodiments.

FIG. 3B is a flow chart of a safety interlock process in accordance with some embodiments. The safety interlock process is operated by the controller 130 incorporated within the stocker system 100. The controller 130 is operatively coupled to the entrance system 310 and controls the operations of the entrance system 310 so that the operators entering into the stocker system 100 do so safely. In some embodiments, the safety interlock assembly may be included in the controller 130. However, other variations and arrangements may be implemented. For example, as in this case, the safety interlock assembly may be part of the entrance system 310 that is operatively connected to the controller 130.

In accordance with the embodiment of FIG. 3B, the operators may request via the entrance system 310 access for entering into the stocker system 100 (e.g., including EUV pod stocker 101) at step 360. The oxygen cylinder detection assembly 320 may then check the oxygen cylinder(s) using the oxygen pressure detector at step 370. The operator mask and piping scanning assembly 330 may check the operator masks and oxygen delivery pipes to check whether the mask and/or the pipes are properly operating and not leaking. The operator identifier scanning assembly 340 scans the operator ID of the operators entering the stocker system 100. The entrance system 310 may grant access when the number of operators entering the stocker system 100 are two or more. The above inspection procedures are performed at step 370. In some embodiments, the order of the inspection procedures may be different than the order set forth above. For example, the operator identifier scanning assembly 340 may operate first, and the oxygen cylinder detection assembly 320 may operate subsequently, and finally the operator mask and oxygen piping scanning assembly 330 may operate. While the order of the inspection procedures can be performed in various orders, if any one of the inspection procedures fails, the request to enter the stocker system 100 is denied and the inspection procedure may have to be performed more than once. For instance, if the oxygen cylinder detection assembly 320 detects that the oxygen pressure is less than 5 MPa, the oxygen may be added to the oxygen cylinder so that the oxygen pressure is more than or equal to 5 MPa. In another instance, if only a single operator tags through the operator identifier scanning assembly 340, that operator may need to wait to enter the stocker system until another operator can join, before the entrance system 310 allows the operators to enter into the stocker system 100. In yet another instance, in the event the oxygen mask and oxygen piping scanning indicates that the oxygen mask and/or the oxygen piping is not operating properly, the operator will need to either fix the oxygen mask and/or the oxygen piping or don a different oxygen mask and/or oxygen piping before retesting both.

If all of the inspection procedures are checked and the results are positive, the entrance system 310 unlocks the door and allows the operators to enter the stocker system 100 at step 380.

Figure 4:
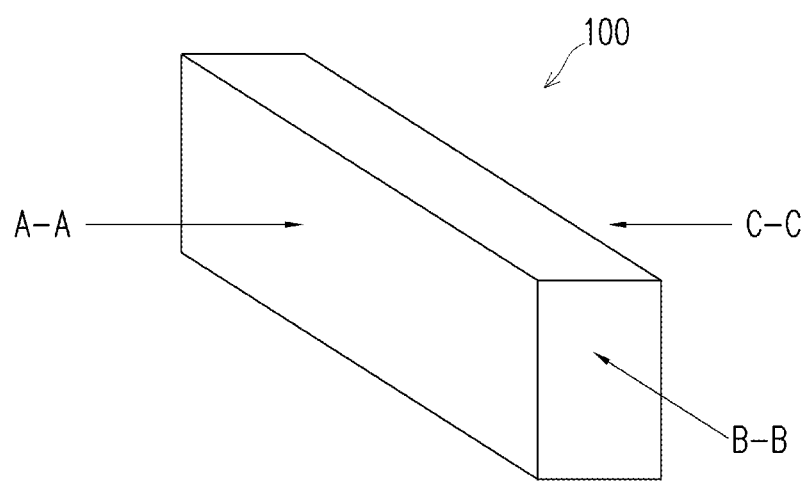
FIG. 4 is a schematic view of a stocker system in accordance with some embodiments.

FIG. 4 is a schematic view of a stocker system in accordance with some embodiments. FIG. 4 illustrates a simplified view of the stocker system 100. The view of a stocker system 100 from an A-A side is described with reference to FIG. 5A below. The view of a stocker system 100 from a B-B side is described with reference to FIG. 5B below. The view of a stocker system 100 from a C-C side is described with reference to FIG. 5C below.

Figure 5B:
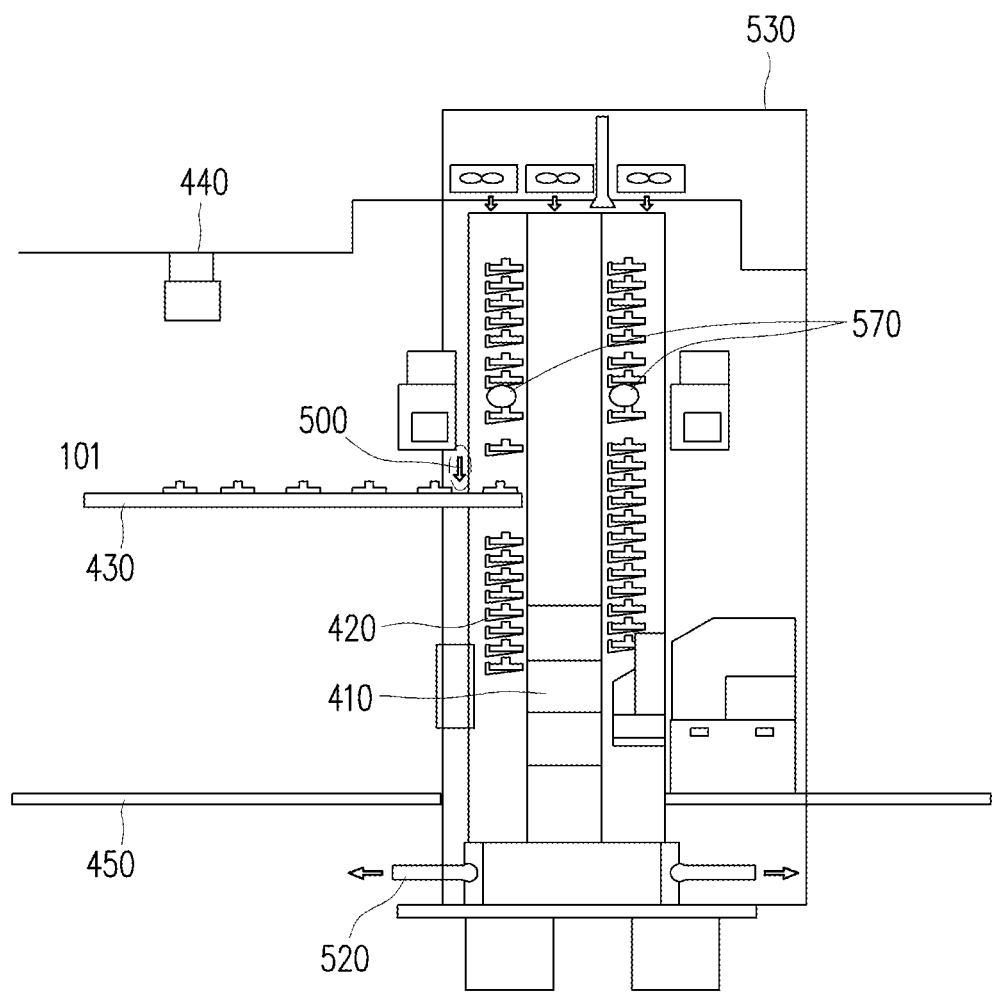
FIG. 5B is a view of a stocker system from a B-B side of FIG. 4 in accordance with some embodiments.

As shown in FIG. 5B, the stocker system 100 includes a robot crane 410. The robot crane 410 is configured to transfer EUV pods 420 within stocker 101. For example, in the stocker system 100, it is beneficial for the EUV pods 420 to be transferred through the robot crane 410. Further, implementing transfer automation within the stocker system 100 may also be beneficial for operator safety and quality reasons as well. The dimension of the robot crane 410 and the EUV pods 420 may depend on the height of the clean room.

The stocker system 100 includes an automatic input/output interface (or auto I/O) 430. The auto I/O 430 is for controlling the interface process for transferring EUV pods 420 between the AMHS system (e.g., OHT 440) and the stocker system 100.

In some embodiments, the height at which the auto I/O 430 is positioned is above a raised floor 450, e.g., the auto I/O 430 may be at least 2 meters above the raised floor 450. Maintaining a height of 2 meters above the raised floor 450 allows the operators to safely operate within the stocker system 100 without colliding or interfering with the OHTs 440 transferring EUV pods 420 to and from the auto I/O 430. Further, the OHT 440 may operate at a height similar or higher than the auto I/O so that the OHT 440 freely transfers and hovers in the stocker system 100.

As shown in FIG. 5A, stocker 101 includes a manual port 460 where an operator removes the EUV pods 420 from the stocker 101 or feeds EUV pods 420 to the stocker 101 manually. The height of the manual port 460 with respect to the raised floor 450 may vary and is chosen to accommodate the operators using the manual port 460. For example, the top surface of the manual port 460 from the top surface of the raised floor 450 may be about 70 cm.

The stocker system 100 includes a MAU (Make-up Air Unit) 470, a FFU (Fan Filter Unit) 480 and a DCC (Dry Cooling Coil) 490. The MAU 470 (or air source 470) is configured to supply fresh air to stocker 101. The FFU 480 (or a filtering assembly 480) is configured to filter fresh air received from the MAU and supply it into the stocker 101. The DCC 490 is configured to control temperature of gas supplied to stocker 101 of the stocker system 100. One feature of the MAU 470 and the FFU 480 is to control the oxygen concentration in the stocker 101 so that the $O_2$ concentration in the stocker system 100 is kept higher than a threshold level or maintained at a threshold range. For example, in some embodiments of the present disclosure, the oxygen concentration threshold range is about 19.5% to 21%. For example, if an oxygen concentration detection assembly 720 (in FIG. 7) senses that the $O_2$ concentration is less than this range (e.g., having less than 19.5% of oxygen concentration in the stocker system 100), the oxygen concentration detection assembly controls the MAU 470 and the FFU 480 so that the air flow is increased in an effort to increase the concentration of oxygen in the stocker system 100. The air flow may be increased through the MAU 470 and the FFU 480 to increase $O_2$ supply volume until the $O_2$ concentration within the stocker system 100 comes within the threshold range.

The DCC 490 controls the temperature within the stocker 101 of stocker system 100 so that the temperature is maintained within a particular temperature range. For example, in some embodiments, the DCC 490 controls the temperature within the stocker 101 to be around 23° C.±2° C. If the temperature within the stocker 101 of stocker system 100 goes below or above this range, the DCC 490 will either provide cooling to lower the temperature within the stocker 101 to around 23° C.±2° C. or provide heating to increase the temperature within the stocker 101 to around 23° C.±2° C.

The stocker system 100 implements an independent air return design including MAU 470, FFU 480, and DCC 490 so that it does not share an air return system with EUV tools in vicinity of the stocker system 100. For example, in case of fire or smoke or other hazardous conditions, it is beneficial that the stocker system 100 and the other EUV tools use independent and different air return systems. This is partially because if the EUV stocker is on fire or is generating smoke or other particulate material that is transported in the air, the smoke or particulate material would be readily transferred to the other EUV tools through the shared air system. Accordingly, one or more benefits of the stocker system 100 according to the present disclosure is its implementation with an independent air return system that is distinct from air systems supporting other EUV tools in the vicinity.

As part of the independent air return system in accordance with some embodiments of the present disclosure, an air curtain 500 is used for the auto I/O 430 and the OHT 440. For example, the OHT 440 transfers EUV pods 420 to the auto I/O 430 which in turn transports the EUV pods 420 into the stocker system 100. By employing an air curtain 500 at the entrance of the auto I/O 430 into stocker system 100, the air curtain 500 prevents or minimizes unwanted materials in gaseous form or particulate form from entering the stocker system 100 during the transfer of EUV pods 420 into the stocker system 100. Further, the air curtain 500 impedes $N_2$ leakage from the stocker. For example, if a physical door is used to replace the air curtain 500, it may impact the transfer performance of the OHT that moves in/out of the stocker due to the open/close time of the physical door. With the air curtain 500, delays in transfer time resulting from having to wait for a physical door to open and close can be reduced and $N_2$ leakage can be reduced or prevented.

Figure 5C:
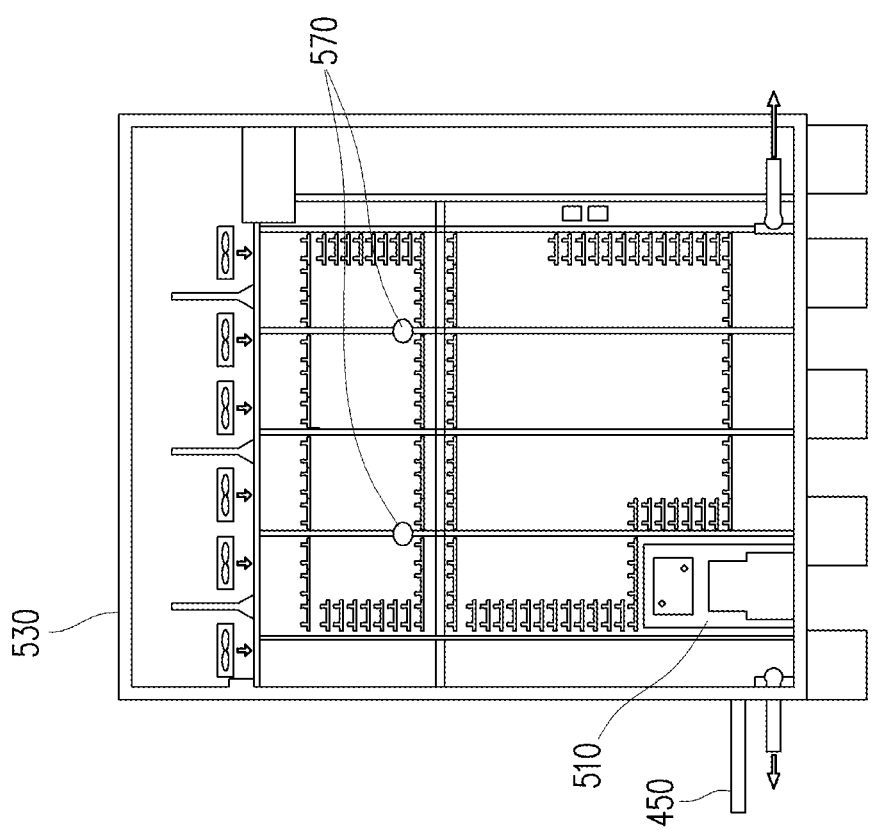
FIG. 5C is a view of a stocker system from a C-C side of FIG. 4 in accordance with some embodiments.

As shown in FIG. 5C, stocker system 100 includes a manual port (or an entrance door) 460 that is used by operators to manually transfer the EUV pods 420 into stocker system 100. In some embodiments, the manual port 510 is further designed to prevent $N_2$ leakage from the stocker system 100, for example via the provision of a gas, e.g., air curtain.

As shown in FIGS. 5A and 5B, an exhaust 520 is used for diluting the $N_2$ concentration if needed. For example, the exhaust 520 is used for down flow enhancement and for reducing $N_2$ concentration in the stocker environment. In one or more embodiments, an $N_2$ supply piping system is installed for each shelf of the stocker. After the $N_2$ gas is supplied to the individual EUV pods in the stocker and used, the $N_2$ gas may leak from each EUV pods. Some portion of the leaked $N_2$ gas flows into the independent air return space 530. For example, the $N_2$ gas is processed through the DCC 490 and FFU 480, the $N_2$ gas may be provided into the stocker environment after being mixed with fresh air from MAU 470. Another portion of the $N_2$ gas flows out of the stocker system 100 through the exhaust 520 which results in the $N_2$ concentration being diluted. One function of the exhaust is to allow $N_2$ gas in the stocker environment to leave the FAB continually. Meanwhile the MAU 470 supplies fresh air to the stocker system which can dilute the $N_2$ concentration in the stocker.

As noted above, stocker system 100, includes an independent air return boundary 530. In some embodiments, the independent air return boundary 530 is to the exterior of the stocker 101. The independent air return boundary encompasses the stocker 101 and forms a gas return plenum between the exterior of the stocker 101 and the independent air return boundary. The independent air return boundary 530 is implemented between the MAU 470 and a waffle 540 (e.g., a waffle-shaped supporting structure). In order to isolate the stocker system 100 and prevent gas from the stocker system 100 from being mixed with the air supply of surrounding EUV tool areas (e.g., areas outside of the independent air return boundary 530 where other EUV tools and equipment are located), the independent air return boundary 530 is utilized. In some embodiments, the independent air return boundary 530 may have one or more openings 550 for connecting to the MAU 470 to receive air supply. In one or more embodiments, the openings 550 may include valves for channeling air flow.

$O_2$ sensors 560 are located at various locations within the stocker system 100 to detect $O_2$ concentration. Additional $O_2$ sensors 560 may be added at different locations. In some embodiments, a set of $O_2$ sensors 560 are placed for every 1 $m^3$ in the stocker 101 of stocker system 100. In addition, as shown in FIGS. 5A, 5B, and 5C, pressure sensors 570 may be located at various locations within the stocker 101 of stocker system 100 to detect the pressure in the stocker 101. These pressure sensors 570 support determination of the pressure difference between inside of the stocker system 100 and the outside of the stocker system 100. For example, it is beneficial to keep positive pressure in the stocker system 100 relative to the environment external to the stocker system 100.

Figure 6:
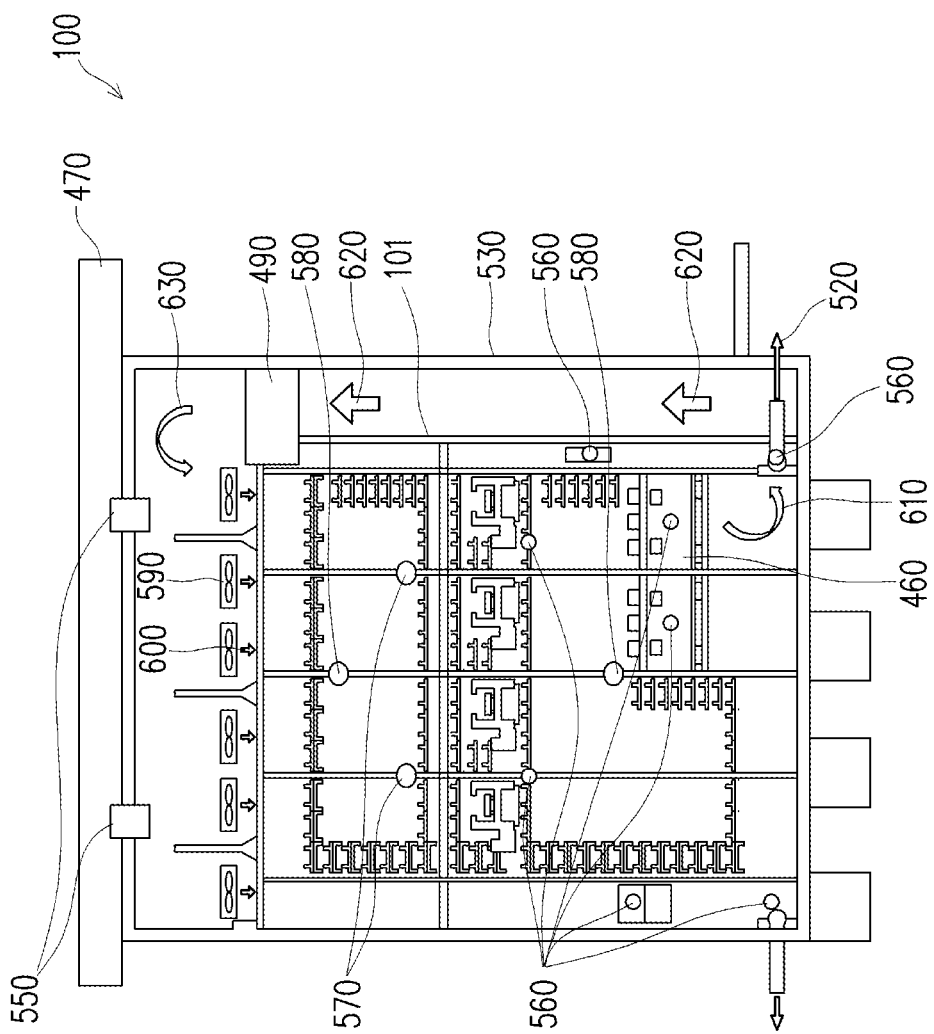
FIG. 6 is a view of a stocker system showing an air flow within the stocker in accordance with some embodiments.

As described, in one or more embodiments, a controller is operatively coupled to the stocker 101 or storage space of stocker system 100, the controller is configured to control at least one of air or other gas flow supply to the storage space, hydrocarbon concentration in the storage space, oxygen concentration in the storage space, humidity within the storage space, pressure within the storage space, or temperature in the storage space FIG. 6 is a view of a stocker system 100 showing a gas flow within the stocker and stocker system 100 in accordance with some embodiments.

FIG. 6 shows the gas flow within the stocker system 100 from an A-A side view as illustrated in FIG. 5A. The $N_2$ gas is supplied to the individual EUV pods that are stored in the racks of the stocker 101. The independent air return boundary 530 encompasses the area of the stocker 101. The independent air return boundary 530 surrounding a larger area than the stocker 101 enables the independent air return boundary 530 to recycle some of the gas flow within the stocker 101. The $N_2$ gas supplied to the individual EUV pods may leak from the pods. The leaked $N_2$ gas flows in a direction of arrow 610. Here, some portion of the $N_2$ gas is sent out through the exhaust 520 and this may result in the dilution of the $N_2$ concentration within the independent air return boundary 530. Other portion of the $N_2$ gas is supplied in the direction of arrow 620 and is supplied to the DCC 490. Thereafter, the $N_2$ gas is directed in a direction of arrow 630 where it is mixed with the air supplied from the MAU 470. The MAU 470 supplies fresh air, or other oxygen containing gas, into the independent air return boundary 530 through the one or more openings 550 in the independent air return boundary 530. This air is then supplied through an air supplier 590 to the stocker 101 together with the $N_2$ gas. In some embodiments, the air supplier 590 is a FFU which filters the air from the MAU before delivering the filtered air into the stocker. Air received from the MAU 470 and the DCC is transferred through the air supplier 590 into stocker 101 in a direction 600 as shown in FIG. 6. After the air is delivered to the stocker 101, it flows downward and exits the stocker 101 in the direction 610. This cycle may be repeated.

In the stocker system 100, the system includes oxygen sensors 560, pressure sensors 570, and hydrocarbon detection sensors 580 at one or more locations to measure oxygen concentration, pressure within the stocker, and hydrocarbon concentration within the stocker, respectively.

Based on the current status of the air, the exhaust 520 may release gas to an environment outside the stocker system 100 to dilute the concentration of $N_2$ gas as well as other gas. The rest of the air including $N_2$ gas, $O_2$ gas, as well as other gases may circulate in a direction 620 as shown in FIG. 6. Further, as explained previously, the $N_2$ gas supplied to the individual EUV pods in the stocker may be used to purge and may later naturally leak from each EUV pods. A portion of this $N_2$ gas may then flow into the exhaust 520 and a portion may flow in the independent air return boundary 530 as indicated by arrows 620.

Figure 7:
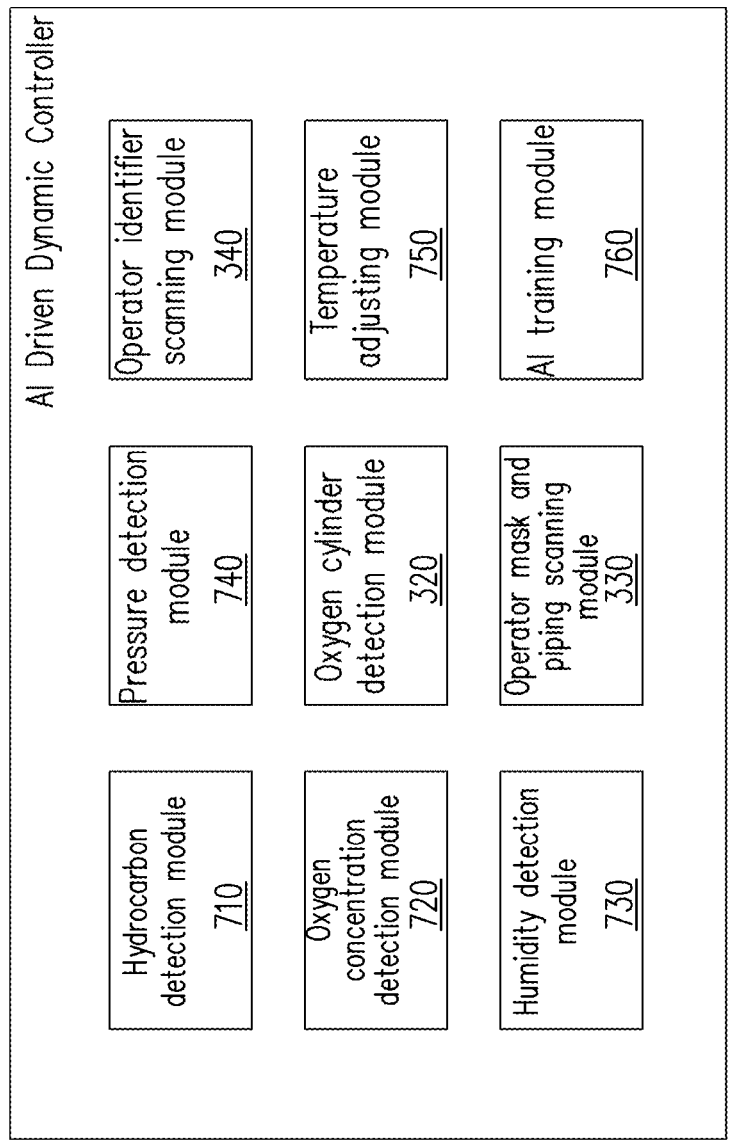
FIG. 7 is a block diagram of an AI driven dynamic controller in accordance with some embodiments.

The controller 130 of the stocker system 100 includes a temperature adjusting assembly (750 in FIG. 7). The temperature adjusting assembly 750 is operatively connected to the DCC 490. When the temperature adjusting assembly 750 detects that the temperature within the stocker 101 of the stocker system 100 is outside of the desired temperature range, (e.g., 23° C.±2° C.), the temperature adjusting assembly 750 controls the DCC 490 so that the DCC 490 heats or cools down the air within the independent air return boundary 530 to maintain the temperature within the stocker 101 to within the desired range. After the air is heated (or cooled), the air is supplied in a direction 630 as shown in FIG. 6 and into the air supplier 590. The independent air return boundary 530 of the stocker system 100 supports the independent control of the temperature of the air flow and separates the air flow within the stocker system 100 from the air flow systems of other EUV tools.

FIG. 7 is a block diagram of an AI driven dynamic controller in accordance with some embodiments.

In one or more embodiments of the present disclosure, the AI driven dynamic controller 130 is configured to detect hydrocarbon concentration in the stocker 101 through a hydrocarbon detection assembly 710 (or a hydrocarbon detection module 710). The presence of hydrocarbons within the stocker 101 that are transferred to subsequent EUV tools can cause damage to the EUV masks stored in the stocker. For example, hydrocarbon particles may coat or deposit on the EUV masks. If such EUV masks that have been damaged by the hydrocarbons are used in the EUV tool, the substrates (or wafers) processed using these damaged EUV masks will be adversely impacted, e.g., the patterned features will not meet critical dimension criteria. Accordingly, it is beneficial to detect the level of hydrocarbon in the stocker and take steps to reduce the concentration of the detected hydrocarbons. For example, in some embodiments, the hydrocarbon detection assembly 710 detects a concentration of hydrocarbon inside the stocker 101 and determines whether it is more than a threshold level. In some embodiments, the threshold level may be 10 ppm. If the hydrocarbon concentration in the stocker 101 is more than 10 ppm, the flow rate of $N_2$ gas supply may be increased to drop the hydrocarbon concentration to less than 10 ppm. Here, a threshold level of the hydrocarbon concentration is selected as 10 ppm. However, in other embodiments, based on various different settings, the threshold level may be a value less than 10 ppm or a value greater than 10 ppm.

The AI driven dynamic controller 130 is configured to detect oxygen concentration in the stocker system 100 through an oxygen concentration detection module 720 (or an oxygen concentration detection assembly 720). The oxygen concentration detection assembly 720 ensures that the $O_2$ concentration is controlled at a selected level of $O_2$ concentration in the stocker system 100. For example, if the oxygen concentration detection assembly 720 senses that the $O_2$ concentration is less than the oxygen threshold range which may be between 19.5%-21%, the oxygen concentration detection assembly 720 controls the MAU so that the air flow is increased. The air flow may be increased through the MAU to increase the $O_2$ supply volume until the $O_2$ concentration is within the threshold range.

The AI driven dynamic controller 130 is configured to detect humidity in the stocker system 100 through a humidity detection module 730 (or a humidity detection assembly 730). The humidity detection assembly 730 included in the controller 130 is operatively coupled to one or more humidity sensors to ensure that the humidity level is controlled at a selected level (e.g., a threshold level) in the stocker system 100. If the humidity level exceeds the predetermined threshold level, the EUV masks are impacted (e.g., surface of the EUV masks may be damaged). For example, if the humidity detection assembly 730 detects that the humidity within stocker 101 is more than about 10%, the humidity detection assembly 730 controls (e.g., increases) the $N_2$ gas supply flow rate so that humidity drops below 10%.

The AI driven dynamic controller 130 is configured to detect pressure in the stocker system 100 through a pressure detection module 740 (or a pressure detection assembly 740). The pressure detection assembly 740 is operatively coupled to the pressure sensor to ensure that the pressure is controlled such that the pressure of the stocker system 100 is higher than the pressure of a clean room (e.g., room outside the stocker system 100). For example, if the pressure of the stocker system 100 is less than a threshold level (e.g., the pressure of the clean room), any unwanted external foreign materials, particles present in the clean room may flow into the stocker system 100. Accordingly, if the pressure of the stocker system 100 is less than the pressure of the clean room, the pressure detection assembly 740 controls the air flow through the MAU such that the pressure of the stocker system 100 becomes higher than the pressure of a clean room.

In some embodiments, the controller 130 also includes the oxygen cylinder detection assembly 320, the operator mask and piping scanning assembly 330, and the operator identifier scanning assembly 340. However, in other embodiments, the oxygen cylinder detection assembly 320, the operator mask and piping scanning assembly 330, and the operator identifier scanning assembly 340 can be part of a separate microprocessor that is operatively coupled to the controller 130 and may not necessarily be included in the controller 130.

The AI driven dynamic controller 130 includes a temperature adjusting module 750 (or a temperature adjusting assembly 750). In some embodiments, the temperature adjusting assembly 750 may not be included in the controller 130 but may be operatively coupled to the controller 130 to perform the temperature adjusting function of the assembly.

Because the controller 130 is driven with AI algorithms and technology, the controller 130 includes an AI training circuit 760 (or AI training module 760) capable of training the system to employ one or more artificial intelligence techniques. "Artificial intelligence" is used herein to broadly describe any computationally intelligent systems and methods that can learn knowledge (e.g., based on training data and further based on actual measured data), and use such learned knowledge to adapt their approaches for solving one or more problems, for example, by making inferences based on a received input such as measurements (measurement data) received via the stocker system 100. Artificially intelligent machines may employ, for example, neural network, deep learning, convolutional neural network, Bayesian program learning, and pattern recognition techniques to solve problems such as determining the conditional requirements within the stocker system 100 and dynamically addressing the conditions (e.g., $N_2$ concentration and flow rate, hydrocarbon concentration, pressure level, $O_2$ concentration, temperature, humidity level, air flow rate or the like) in the stocker system 100 using AI technology. Further, artificial intelligence may include any one or combination of the following computational techniques: constraint program, fuzzy logic, classification, conventional artificial intelligence, symbolic manipulation, fuzzy set theory, evolutionary computation, cybernetics, data mining, approximate reasoning, derivative-free optimization, decision trees, and/or soft computing. Employing one or more computationally intelligent techniques, the controller 130 may learn to automatically determine and apply the safe and optimized conditions for yield in the stocker system 100.

Various training inputs may further be provided to the AI training circuit 760 for training purposes. The training input may include, for example, the gas flow rate supply data, gas composition data, pressure data, air circulation rate data, oxygen concentration data, humidity data, hydrocarbon concentration data, temperature data and other various data measured in the stocker system 100. These training data may be inputted to the AI training circuit 760 manually initially, but after some training process, the AI training circuit 760 will further learn and improve based on the actual measured data collected while the stocker system 100 operates.

In some embodiments, using training data, the AI training circuit 760 may implement an iterative training process. Training may be based on a wide variety of learning rules or training algorithms. For example, the learning rules may include one or more of the following: back-propagation, real-time recurrent learning, pattern-by-pattern learning, supervised learning, unsupervised learning, semi-supervised learning, reinforcement learning, self-learning, feature learning, sparse dictionary learning, anomaly detection, interpolation, weighted sum, reinforced learning, temporal difference learning, and/or recording learning.

One exemplary training algorithm that can be used in the AI training assembly 760 is the back-propagation learning algorithm which is a common method of training artificial neural networks. Back-propagation generally includes two phases: propagation and weight update. In the propagation phase, a training pattern's input is forward propagated through a neural network in order to generate the propagation's output activations. Then, the propagation's output activations are backward propagated through the neural network using the training pattern target in order to generate deltas (i.e., the difference between the input and output values) of all output and hidden neurons. In the weight update phase, for each weight-synapse the following steps are generally performed: the first step is multiply its output delta and input activation to get the gradient of the weight; the second step is subtract a ratio (percentage) of the gradient from the weight. The propagation and weight update phases are repeated as desired until performance of the network is satisfactory.

In one or more embodiments, the AI training circuit 760 may recognize the various patterns with respect to the gas supply, storage automation, transfer automation, operator safety, independent air return, and safety interlock described above. The AI driven dynamic controller 130 may further improve the operations of the stocker system 100 as these patterns are better recognized through the training of the AI training circuit 760.

For example, in one or more embodiments, the AI training circuit 760 is operatively connected to (or included in) the controller and the AI training circuit 760 may recognize data patterns of at least one of the air flow supply rate to the storage space, nitrogen flow supply rate to the EUV pods, the hydrocarbon concentration in the storage space, the oxygen concentration in the storage space, the humidity within the storage space, the pressure within the storage space or the temperature in the storage space.

Figure 8:
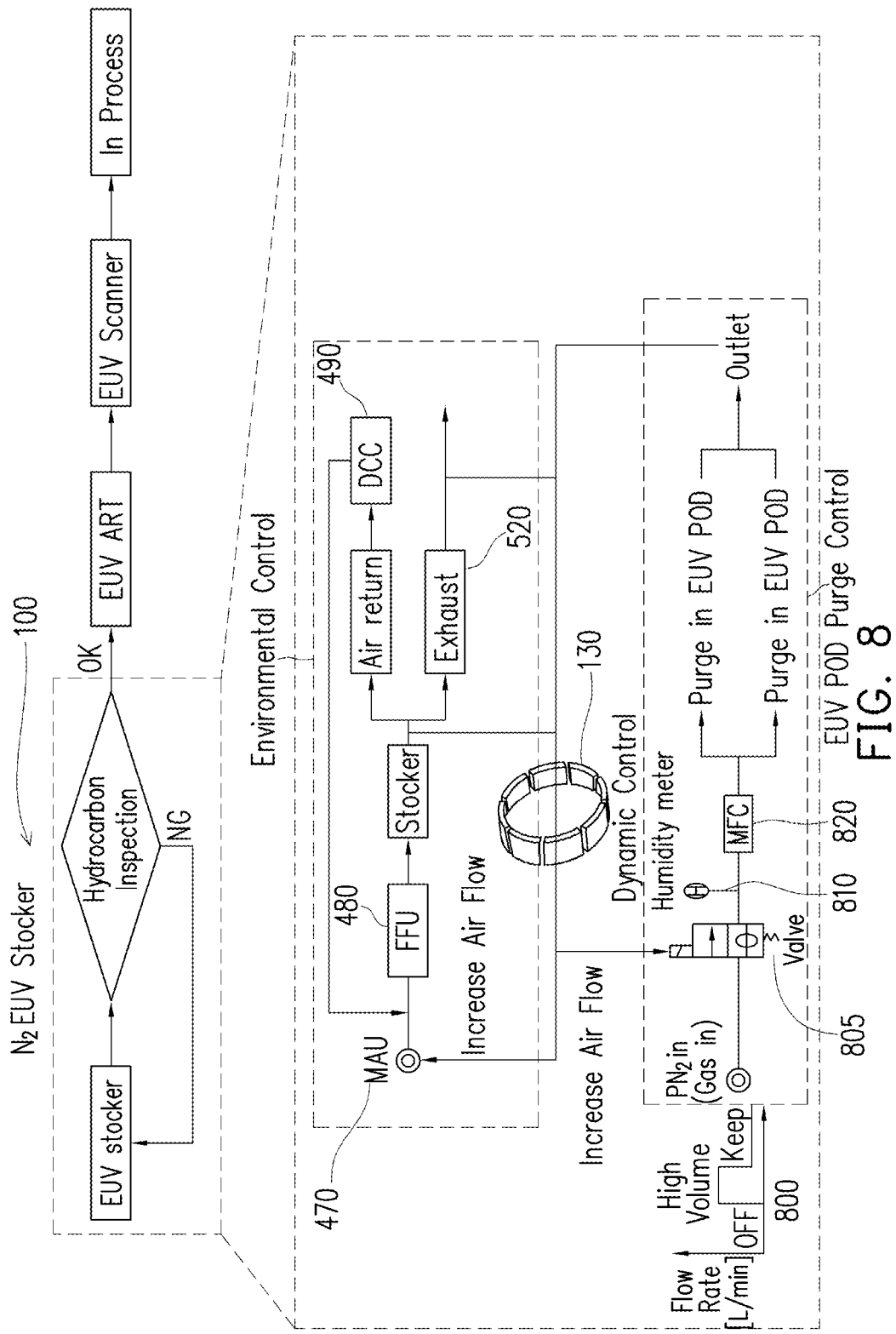
FIG. 8 is a dynamic control flow process of the AI driven dynamic controller in accordance with some embodiments.

FIG. 8 is an example of a dynamic control flow process of an AI driven dynamic controller 130 in accordance with some embodiments.

In the stocker system 100 (e.g., EUV pod stocker 101), the system is inspected to check at least one or more of the hydrocarbon concentration within the stocker 101, $O_2$ concentration, pressure level, humidity level, $N_2$ concentration, $N_2$ flow rate or air flow rate. If these factors are inspected and are in line with the required condition, the substrates in the EUV pods are transferred using EUV ART (automatic radical transportation) to the EUV scanner. Examples of EUV ART includes, but are not limited to AMHS, OHT, MR (mobile robot), AGV (automated guided vehicles), RGV (Rail Guided Vehicle) or the like. In one or more embodiments, the EUV ART supports the transfer of EUV pods between the stocker and the EUV tool. After the scanning process of the EUV tools including EUV masks are completed, the EUV masks in the EUV pods are used in the EUV process. In some embodiments, the controller of the stocker system 100 may automatically control the automated machinery mentioned above based on the patterns recognized by the AI training circuit 760 (e.g., fluctuations in measurements with respect to a period of time of at least one of the air flow supply to the storage space, the hydrocarbon concentration in the storage space, the oxygen concentration in the storage space, the humidity within the storage space, the pressure within the storage space or the temperature in the storage space, or the like).

In the stocker 101, pure $N_2$ gas (PN2) is supplied at 800 through one or more valves 805. In accordance with embodiments of the present disclosure, to improve the storage quality (e.g., minimize degradation through oxidation or minimize contamination of EUV masks in individual EUV pods) the $N_2$ gas is supplied to individual EUV pods at a high volume initially. After a certain period of time, the high volume supply of $N_2$ gas to the EUV pods is controlled and maintained at a lower flow rate (L/min) than the previous high volume supply. The controller may dilute the pure nitrogen by combining the pure nitrogen with air. The supply is dynamically controlled by the controller 130 taking into consideration various specification parameters of the EUV pod storage as well as the stocker environment. Based on the various settings and parameters, the controller will control the level of gas supply and the duration of the gas supply to the EUV pods to improve storage quality of the EUV pod storages. For example, if the humidity of the combined pure nitrogen and air supplied to the individual EUV pods rises above a predetermined amount, e.g., 10%, the controller will increase the flow rate of nitrogen gas to stocker 101 until such time that the humidity returns to the desired level and/or may decrease the flow rate of air that is combined with the pure nitrogen.

In FIG. 8, a humidity meter 810 senses the level of humidity of the purge gas delivered to the individual EUV pods or the purge gas that escapes the EUV pods. The gas is distributed based on piping designs in accordance with a MFC (mass flow control) 820 system. The purge process in the EUV pod is performed and a portion of the purge gas leaks from the EUV pods. When the humidity of the purge gas is detected to be higher than 10%, or the oxygen concentration is detected to be lower than 19.5%, and the pressure of the stocker 101 is detected to be lower than the environment external to the stocker system 100, the dynamic controller 130 controls the MAU 470 to increase air flow into stocker system 100 and increase the flow rate of $N_2$ gas (as explained previously, one benefit of the $N_2$ gas is that $N_2$ gas reduces humidity). Increasing the air flow into stocker system 100 can increase the pressure within stocker system 100. Increasing air flow into stocker system 100 will increase the oxygen concentration within the stocker 101 or decrease the oxygen concentration within the stocker depending upon what the current oxygen concentration is within stocker 101. The FFU 480 filters the fresh air and supplies it into the stocker.

According to some embodiments, inside stocker system 100, hydrocarbon concentration is detected using the hydrocarbon sensors 580. In one or more embodiments, the hydrocarbon sensors 580 are installed in the EUV pods located in the stocker 101 of the stocker system 100. The hydrocarbon sensors 580 are configured to detect a concentration of hydrocarbon in the EUV pods and when the hydrocarbon concentration is above about 10 ppm, the controller operatively coupled to the EUV pods signals the air flow supply so that nitrogen gas is supplied to the EUV pods. The increase of nitrogen gas reduces the concentration of hydrocarbon within the EUV pods. Once the hydrocarbon concentration is below about 10 ppm, the controller may maintain the level of nitrogen gas supplied to the EUV pods. When the hydrocarbon concentration is below about 10 ppm, the controller may maintain or increase or decrease the flow of nitrogen gas to meet other air requirements within the EUV pods and the stocker 101. For example, $N_2$ gas is also used to reduce humidity in the EUV pods. Accordingly, when the hydrocarbon concentration is maintained at a desirably low levels, the nitrogen gas may be increased or decreased based on other factors such as humidity. As explained, increasing nitrogen gas assists in reducing the humidity in the EUV pods.

According to some embodiments, a portion of the gas exiting stocker 101 is returned to the stocker after being processed with the DCC 490. The DCC 490 controls the temperature of the gas flowing through the DCC 490. The temperature of the gas flowing through the DCC 490 is controlled so that the temperature within the stocker 101 is maintained within a desired range, e.g., around 23° C.±2° C. If the temperature within the stocker 101 is below or above this range, the DCC 490 will either cool gas in the independent air return boundary 530 to reduce its temperature and thereby reduce the temperature within stocker 101, or heat gas in the independent air return boundary 530 to increase its temperature and thereby increase the temperature within stocker 101. Some portion of the gas exiting stocker 101 in the direction 610 is sent through the exhaust 520 to an environment external to stocker system 100. In some embodiments, additionally or alternatively, the oxygen concentration of gas within the stocker 101 is determined from the gas that is exhausted from stocker 101 in the direction 610 or is determined from gas exhausted via exhaust 520.

According to the stocker system 100 implementing the AI driven dynamic controller 130, the safety condition is dynamically adjusted to meet the required condition. This also obviates the need of operators being present in the EUV area. Further, the stocker system 100 is able to provide a safety interlock, an independent air/gas supply, and an independent air return flow. Further technical benefits based on one or more embodiments of the present disclosure will be readily understood by a person of ordinary skill in the art.

Figure 9:
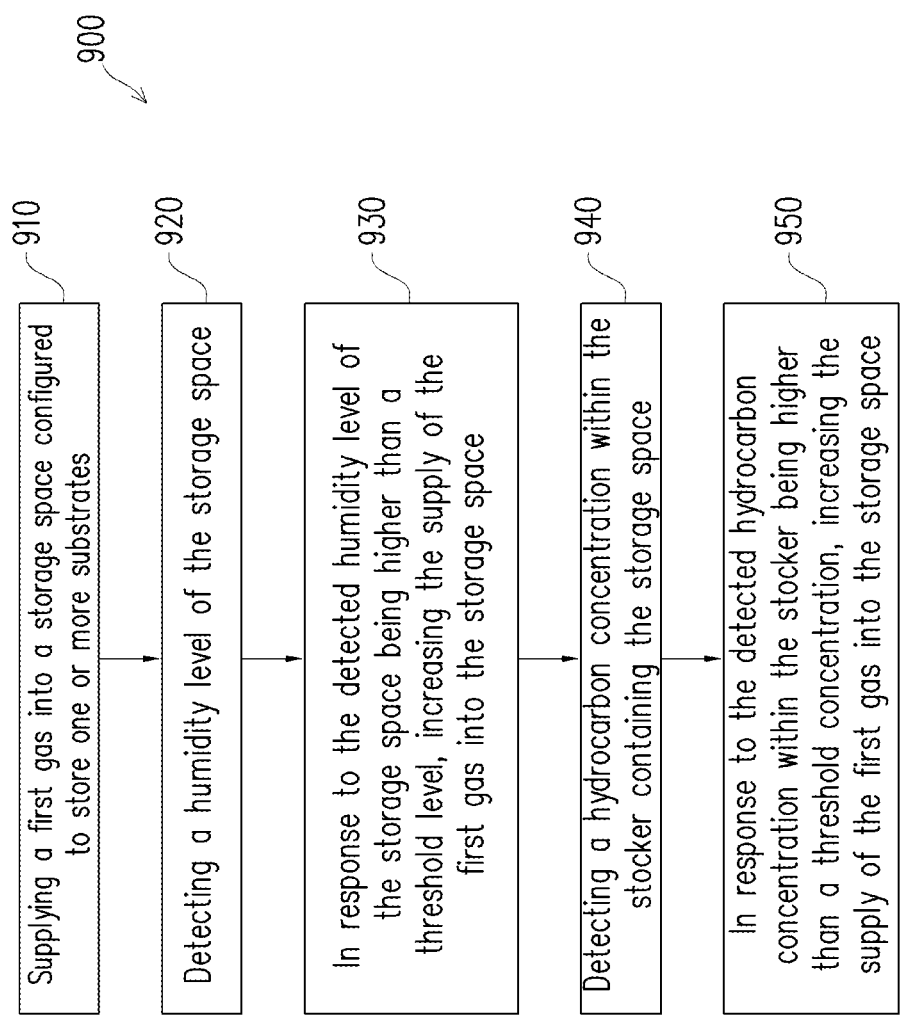
FIG. 9 is a flow chart of a method of controlling a condition within a stocker system according to the present disclosure.

FIG. 9 is a flow chart of a method of controlling a condition within a stocker system according to one or more embodiments of the present disclosure.

The method 900 includes supplying a first gas into a storage space configured to store one or more substrates (at step 910). In some embodiments, the first gas is a nitrogen gas, the storage space is an EUV pod and the substrate is an EUV mask. The method 900 includes detecting a humidity level of the storage space (at step 920). The method 900 includes increasing the supply of the first gas into the storage space in response to the detected humidity level of the storage space being higher than a threshold level (at step 930). The method 900 includes detecting a hydrocarbon concentration within the stocker within which a plurality of storage spaces (at step 940) are stored. The method 900 includes increasing the supply of the first gas into the storage space, in response to the detected hydrocarbon concentration within the storage space being higher than a threshold concentration (at step 950).

In further embodiments, the method includes detecting a pressure level within the storage space. The method may also include increasing the flow rate of a second gas into the storage space, in response to the pressure level within the storage space being lower than a pressure level outside of the storage space.

In yet further embodiments, the method includes detecting an oxygen concentration within the storage space. The method may also include increasing the flow rate of a third gas into the storage space, in response to the oxygen concentration of the storage space being lower than a threshold oxygen concentration.

One or more embodiments of the present disclosure provides a stocker system. The stocker system includes a storage space configured to store one or more substrates. The stocker system also includes a controller operatively coupled to the storage space. In some embodiments, the controller is configured to control at least one of air flow supply to the storage space, hydrocarbon concentration in the storage space, oxygen concentration in the storage space, humidity within the storage space, pressure within the storage space, or temperature in the storage space. The stocker system further includes an artificial intelligence training circuitry operatively connected to the controller. In some embodiments, the artificial intelligence training circuitry is configured to recognize data patterns of at least one of the air flow supply to the storage space, the hydrocarbon concentration in the storage space, the oxygen concentration in the storage space, the humidity within the storage space, the pressure within the storage space or the temperature in the storage space. The stocker system further includes an automated machinery configured to automatically transfer the one or more substrates into and out of the storage space.

One or more embodiments of the present disclosure further provides an EUV storage system. The EUV storage system includes one or more storage units configured to store one or more workpieces, e.g., an EUV mask. The EUV storage system also includes a controller operatively coupled to the one or more storage units. In some embodiments, the controller is configured to control at least one of air flow supply to the storage units, hydrocarbon concentration in the storage units, oxygen concentration in the storage units, humidity within the storage units, pressure within the storage units, or temperature in the storage units. The EUV storage system further includes an artificial intelligence training circuitry operatively connected to the controller. In some embodiments, the artificial intelligence training circuitry is configured to recognize data patterns of at least one of the air flow supply to the storage units, the hydrocarbon concentration in the storage units, the oxygen concentration in the storage units, the humidity within the storage units, the pressure within the storage units, or the temperature in the storage units.

One or more embodiments of the present disclosure further provides a method. The method includes supplying a first gas into a storage space configured to store one or more substrates. The method includes detecting a humidity level of the storage space. The method also includes increasing the supply of the first gas into the storage space in response to the detected humidity level of the storage space being higher than a threshold level. The method includes detecting a hydrocarbon concentration within the storage space. The method includes increasing the supply of the first gas into the storage space in response to the detected hydrocarbon concentration within the storage space being higher than a threshold concentration. In some embodiments, the first gas includes nitrogen gas.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A stocker system, comprising:
a storage pod configured to store one or more masks, the storage pod contained in a stocker;
a controller operatively coupled to the stocker system, the controller is configured to control at least one of air flow supply to the storage pod, hydrocarbon concentration in the stocker, oxygen concentration in the storage pod, humidity within the storage pod, pressure within the storage pod, or temperature in the storage pod;
an artificial intelligence training circuitry operatively connected to the controller, the artificial intelligence training circuitry configured to recognize data patterns of at least one of the air flow supply to the storage pod, the hydrocarbon concentration in the stocker, the oxygen concentration in the storage pod, the humidity within the storage pod, the pressure within the storage pod or the temperature in the storage pod;
an automated machinery configured to transfer the storage pod into and out of the stocker; and
a safety interlock assembly operatively coupled to the controller, the safety interlock assembly including:
an operator equipment scanning assembly configured to determine whether equipment for operators entering into the stocker system is functionally operating; and
an operator identifier scanning assembly configured to scan an identification of operators entering the stocker system.

2. The stocker system according to claim 1, wherein the controller is further configured to automatically control the automated machinery based on the data patterns recognized by the artificial intelligence training circuitry.

3. The stocker system according to claim 1, wherein the data patterns include fluctuations in measurements with respect to a period of time of at least one of the air flow supply to the storage pod, the hydrocarbon concentration in the stocker, the oxygen concentration in the storage pod, the humidity within the storage pod, the pressure within the storage pod or the temperature in the storage pod.

4. The stocker system according to claim 1, further comprising a hydrocarbon detection assembly, the hydrocarbon detection assembly configured to detect a concentration of hydrocarbon in the stocker,
wherein the controller is configured to maintain a hydrocarbon concentration in the stocker to below about 10 ppm by controlling the air flow supply to the storage pod, including nitrogen gas, in response to the concentration of hydrocarbon detected by the hydrocarbon detection assembly.

5. The stocker system according to claim 1, wherein the safety interlock assembly further includes:
an oxygen pressure detector configured to detect pressure of an oxygen supply.

6. The stocker system according to claim 5, wherein the oxygen pressure detector is configured to detect whether a pressure of the oxygen supply is above about 5 MPa.

7. The stocker system according to claim 1, further comprising an independent air supply subsystem operatively coupled to the controller, the independent air supply subsystem including:
an air source configured to supply air for the stocker system;
a filtering assembly configured to filter the air supplied from the air source before supplying the air to the stocker;
a temperature adjusting assembly configured to adjust the temperature of a gas that will flow into the stocker; and
one or more oxygen sensors configured to detect the oxygen concentration in the stocker,
wherein the controller controls the air supply so that the oxygen concentration in the storage pod is increased.

8. The stocker system according to claim 7, wherein, in response to the one or more oxygen sensors detecting that the oxygen concentration in the storage pod is less than a threshold level, the controller controls a flow rate of air from the air source to the storage pod so that the concentration of oxygen in the storage pod is increased.

9. The stocker system according to claim 7, further comprising:
a pressure sensor configured to detect a pressure level within the stocker, the pressure sensor operatively coupled to the controller,
wherein the controller is configured to adjust the flow of air from the air source to the stocker when the detected pressure level in the stocker is below a threshold level.

10. The stocker system according to claim 7, wherein the temperature adjusting assembly is configured to adjust temperature of the gas that will flow into the stocker such that the temperature of the stocker is between about 21° C. and about 25° C.

11. The stocker system according to claim 10, wherein, in response to detecting that the temperature in the stocker is either below about 21° C. or above about 25° C., the temperature adjustment assembly either heats the gas that will flow into the stocker so that the temperature of the gas increases above 21° C. or cools the gas that will flow into the stocker so that the temperature of the gas decreases below 25° C.

12. The stocker system according to claim 1, further comprising:
a humidity sensor configured to detect a humidity level in the stocker, the humidity sensor operatively coupled to the controller, wherein the controller is configured to adjust a flow of nitrogen to the storage pod when the humidity level falls below a threshold level.

13. A method, comprising:
operatively coupling a controller to one or more storage units;
controlling, using a controller, at least one of air flow supply to the storage units, hydrocarbon concentration in the storage units, oxygen concentration in the storage units, humidity within the storage units, pressure within the storage units, or temperature in the storage units;
operatively connecting an artificial intelligence training circuitry to the controller;
recognizing, using the artificial intelligence training circuitry, data patterns of at least one of the air flow supply to the storage units, the hydrocarbon concentration in the storage units, the oxygen concentration in the storage units, the humidity within the storage units, the pressure within the storage units, or the temperature in the storage units;
determining whether equipment for operators entering into the storage units is functionally operating; and
scanning an identification of operators entering the storage units.

14. The method according to claim 13, further comprising:
operatively coupling an independent air supply subsystem to the controller;
supplying air for the storage units using an air source of the independent air supply subsystem;
filtering the air supplied from the air source before supplying the air to the storage units using a filtering assembly of the independent air supply subsystem;
adjusting temperature of gas that will flow into the storage units using a temperature adjusting assembly of the independent air supply subsystem;
detecting the oxygen concentration in the storage units using one or more oxygen sensors of the independent air supply subsystem; and
increasing the oxygen concentration in the storage units by controlling the air source using the controller.

15. The method according to claim 14, further comprising:
in response to the one or more oxygen sensors detecting that an oxygen concentration in the storage units is less than a threshold level, increasing the concentration of oxygen in the storage units by controlling a flow rate of air from the air source using the controller.

16. The method according to claim 14, further comprising:
operatively coupling a humidity sensor to the controller;
detecting, using the humidity sensor, a humidity level in the storage units; and
adjusting a flow of nitrogen to the mask-storage units when the humidity level falls below a threshold level.

17. The method according to claim 14, further comprising:
operatively coupling a pressure sensor to the controller;
detecting, using the pressure sensor, a pressure level within the storage units; and
adjusting the flow of air from the air source to the storage units when the detected pressure level is below a threshold level.

18. A method, comprising:
supplying a first gas into a storage device configured to store one or more substrates;
detecting a humidity level of the storage device;
in response to the detected humidity level of the storage device being higher than a threshold level, increasing the supply of the first gas into the storage device;
detecting a hydrocarbon concentration within the storage device;
in response to the detected hydrocarbon concentration within the storage device being higher than a threshold concentration, increasing the supply of the first gas into the storage device;
determining whether equipment for operators entering into the storage device is functionally operating; and
scanning an identification of operators entering the storage device,
wherein the first gas includes nitrogen gas.

19. The method of claim 18, further comprising:
detecting a pressure level within the storage device; and
in response to the pressure level within the storage device being lower than a pressure level outside of the storage device, increasing a flow rate of a second gas into the storage device.

20. The method of claim 18, further comprising:
detecting an oxygen concentration within the storage device; and
in response to the oxygen concentration of the storage device being lower than a threshold oxygen concentration, increasing a flow rate of a third gas into the storage device,
wherein the third gas includes oxygen.

* * * * *